(12) United States Patent
Gugaliya et al.

(10) Patent No.: US 11,467,214 B2
(45) Date of Patent: Oct. 11, 2022

(54) ANOMALY DETECTION SYSTEM AND METHOD FOR ELECTRIC DRIVES

(71) Applicant: ABB Schweiz AG, Baden (CH)

(72) Inventors: Jinendra Gugaliya, Bangalore (IN); Rahul Kumar-Vij, Bangaloreq (IN); Abhilash Pani, Bengaluru (IN); Arpit Sisodia, Ghaziabad (IN); Nikhil Venkata Saisantosh Podila, Bangalore (IN)

(73) Assignee: ABB Schweiz AG, Baden (CH)

( * ) Notice: Subject to any disclaimer, the term of this patent is extended or adjusted under 35 U.S.C. 154(b) by 420 days.

(21) Appl. No.: 16/670,574

(22) Filed: Oct. 31, 2019

(65) Prior Publication Data
US 2020/0132773 A1    Apr. 30, 2020

(30) Foreign Application Priority Data
Oct. 31, 2018  (IN) .............................. 201841041083

(51) Int. Cl.
*G01R 31/34* (2020.01)
*G06N 20/00* (2019.01)
*G07C 3/14* (2006.01)
(52) U.S. Cl.
CPC ........... *G01R 31/343* (2013.01); *G06N 20/00* (2019.01); *G07C 3/14* (2013.01)

(58) Field of Classification Search
CPC .......... G07C 3/005; G07C 3/14; G06N 20/00; G06N 5/003
USPC .......................................................... 702/58
See application file for complete search history.

(56) References Cited

FOREIGN PATENT DOCUMENTS

CN            103728966      * 11/2016

* cited by examiner

*Primary Examiner* — John H Le
(74) *Attorney, Agent, or Firm* — Leydig, Voit & Mayer, Ltd.

(57) ABSTRACT

One illustrative method comprises retrieving a set of drive information associated with an operation of an electric drive in a time period from a drive control unit and one or more sensor units. The method further includes obtaining reliability information associated with the electric drive from a server. The reliability information is computed in the server, with the set of drive information and a model corresponding to a drive type of the electric drive. The reliability information includes a probability of occurrence of the abnormal condition in a specified future time period. The method further includes, providing at least one condition indication regarding the abnormal condition to one of a human machine interface and a drive controller based on the probability of occurrence of the abnormal condition.

13 Claims, 9 Drawing Sheets

ANOMALY DETECTION SYSTEM AND METHOD FOR ELECTRIC DRIVES

CROSS-REFERENCE TO RELATED APPLICATIONS

This application claims priority to Indian Patent Application No. 201841041083, filed Oct. 31, 2018, the entire disclosure of which is incorporated herein by reference.

TECHNICAL FIELD

The present disclosure relates generally to monitoring operating conditions of electric drives. More particularly, the present disclosure relates to systems and methods for detecting anomalies in operation of electric drives.

BACKGROUND

Electric drives are used to provide controlled power output to electric motors to carry out various industrial operations in process plants. Performance and reliability of industrial operations depends on condition of the electric drives and electric motors to perform industrial operations reliably. The condition of an electric drive depends on condition and duration of operation of various power electronic components of the electric drive such as power electronic converters, filter circuits controller circuits, and inverters. Further, the condition and deterioration also depends on a plurality of physical parameters associated with operation of the electric drive, such as operating currents, voltages, drive temperature, power plate temperature, switching frequency, load torque etc. These parameters associated with operation of the electric drives may be referred to as drive parameters.

Deterioration in the condition of any power electronic component may result in malfunctioning/failure of the electric drive, which in turn causes failure in operation of the electric motor. Similarly, abnormal values of drive parameters such as operating currents, voltages, temperature and/or load torque, may result in failure of the electric drive. Failure of the electric drive may halt multiple industrial processes, which may cause huge losses to a business. Hence, early identification of drive failures is required so that preventive maintenance actions can be undertaken to avoid occurrence of such breakdowns.

Some methods for predicting failure of an electric drive that powers a motor system include applying motor current signature analysis/recurrent neural network method on motor current data. Operating conditions of the electric drive is identified from a current signature of the motor current. Any deviation in the current signature from threshold signatures, indicate operating abnormalities and degradation of the electric drive. Further, some prior art techniques, describe condition monitoring of electric drives, by comparing drive temperatures with predetermined thresholds.

There is a need to consider dependencies between various drive parameters such as voltage, frequency, load torque, drive temperature, current, power and other drive variables that affect operating conditions of the drive for condition monitoring and associated analysis to detect conditions. As failure of an electric drive depends on values of a plurality of drive parameters, and conditions of components of the electric drive, methods that monitor operating conditions of the electric drives based on one drive parameter alone can be limited to detect abnormal conditions arising due to other unmonitored drive parameters. Further operating conditions and thresholds for drive parameters of an electric drive vary according to drive types.

There is accordingly, a need for a method for detecting operating conditions of electric drives based on a plurality of drive parameters and drive types of the electric drives. Such detection should assist in taking preventive actions to avoid occurrence of abnormal conditions in the electric drives.

SUMMARY

An aspect of the present disclosure provides a method for monitoring a condition of an electric drive. The electric drive controls operation of an electric motor in a process plant. The method can be performed by the electric drive coupled to a server. The server can be communicatively coupled to the electric drive over a communication network (e.g. industrial network). Alternately, the drive and server can be part of an industrial computer, in which case the drive and server are integrated in the industrial computer.

The method includes retrieving a set of drive information associated with an operation of the electric drive from a drive control unit and/or one or more sensor units of the electric drive. The set of drive information may be obtained in a time period (e.g. a few hours) of the drive operation. The set of drive information includes values of operating parameters, and an operating status information of the electric motor in the time period. For example, the values of the drive parameters includes values of current, voltage, torque, switching frequency, power plate temperature, and other real-time signals that can be measured by the sensor units, or that can be determined by the drive control unit.

The operating status information of the electric motor is retrieved from a status indicator associated with the electric drive. As an example, the main status word (MSW) signal, or other logical indicator can be used for determining the status. The operating status information includes one or more time instances associated with an energized, idle or a de-energized state of the electric motor that is controlled by the electric drive, during the time period. The electric motor is in the energized, idle or the de-energized state based on an operating condition of the electric drive. For example, the electric motor is in the energized state when the electric drive is switched on and operating, in the idle state when the electric drive is switched on but does not perform an operation, and the electric motor is in the de-energized state when the electric drive is switched off.

The method further includes, obtaining reliability information associated with the electric drive from the server. The reliability information indicate a probability of success in functioning of the electric drive. In an embodiment, the reliability information comprises a probability of occurrence of an abnormal condition in a specified future time period. In an embodiment, the reliability information is computed in the server using a model corresponding to the drive type of the electric drive and the set of drive information as received from the electric drive. The model is configured from history data of drive information associated with an operation of one or more electric drives in one or more process plants, where the one or more electric drives correspond to the drive type of the electric drive.

For computation of the reliability information in the server, one or more values of the operating parameters of the electric drive, at time instances when the electric motor is in the de-energized state is excluded from the set of drive information. Such exclusions of values of the operating parameters, are done to remove abnormal conditions that are known and recorded, so that by using the model, patterns in the set of drive information that identify occurrence of abnormal conditions that are not recorded, can be captured.

The reliability information can also include a condition of the electric drive at a present time instant, one or more abnormal instances identified during the time period, an expected time for occurrence of the abnormal condition, and at least one recommendation corresponding to an operation of the electric drive.

The method further includes providing at least one condition indication to at least one human machine interface (HMI) based on the probability of occurrence of the abnormal condition. The at least one condition indication includes information that indicates a particular condition of the electric drive. In an embodiment, the at least one condition indication includes at least an alert regarding occurrence of the abnormal condition, in case the probability of occurrence is determined to be greater than a first threshold. In an embodiment, the probability of occurrence is greater than the first threshold, when the number of abnormal operating instances identified during the time period is greater than a second threshold. Alternatively, the probability of occurrence of the abnormal condition is dependent on the number of abnormal operating instances identified during the time period. A high number of abnormal operating instances identified by the model during a current time period, indicates a higher probability of occurrence of the abnormal condition in the specified future time period.

In another embodiment, the at least one condition includes an alert and the at least one recommendation. In an embodiment, the alert includes a warning message regarding the occurrence of the abnormal condition, and a time remaining for said occurrence. The at least one recommendation includes preventive measures to be taken to avoid occurrence of the abnormal condition in the specified future time period.

The alert and the at least one recommendation provided on the HMI, is viewable by a maintenance personnel or a service engineer involved in monitoring and maintenance of the process plant. For example, the HMI is a display unit of a smartphone, and the alert and the at least one recommendation is provided within a maintenance portal running on the smartphone.

Another aspect of the present disclosure provides an electric drive and server arrangement for monitoring condition of at least one electric drive in a process plant. The at least one electric drive controls operation of an electric motor in the process plant. The at least one electric drive is coupled to the server. For example, the electric drive can be coupled to the server via an industrial network. Taking another example, the electric drive and server arrangement can be integral part of an industrial computer, wherein both the drive and server are part of a single unit.

The at least one electric drive has a plurality of modules, each of which performs one or more steps of the method described above. Further, the server has a plurality of modules, each of which performs a remaining of the one or more steps of the method. In one embodiment, the at least one electric drive comprises a drive control unit, one or more sensor units, a data acquisition unit, and a communication unit. In an embodiment, the server comprises an input interface, a computing unit, and an output interface. The modules are implemented with a processor(s) of the at least one electric drive, or the server.

For example, the modules may be implemented with a processor of a server, or a controller associated with the electric drive. In another example, the modules may be implemented with a server hosted on a cloud platform, and capable of communicating with the electric drive via a communication network. In an embodiment, the modules may be implemented with a network device communicatively coupled via a wireless communication network to an Ethernet adapter that is coupled to the electric drive.

The drive control unit determines one or more of a set of drive information associated with an operation of the at least one electric drive. The one or more sensor units measure one or more measurable values of operating parameters associated with the at least one electric drive. The data acquisition unit retrieves the set of dive information from the drive control unit and the one or more sensor units. The communication unit communicates the set of drive information to the server.

The server receives the set of drive information at the input interface, and computes using the computing unit, reliability information. The reliability information includes a probability of occurrence of an abnormal condition in a specified future time period, a condition of the electric drive at a present time instant, one or more abnormal operating instances identified during the time period, and a time of occurrence of the abnormal condition.

The computing unit uses a model corresponding to a drive type of the at least one electric drive and the set of drive information to compute the reliability information. The model is selected by the computing unit from a plurality of models, where each model corresponds to a drive type of an electric drive. The plurality of models is stored in a data storage accessible by the server. In an embodiment, the data storage is a memory device that is linked internally to the system. In an embodiment, the data storage is a database coupled externally to the system.

To create the model, the computing unit applies an unsupervised machine learning method (e.g. a clustering algorithm such as Local Outlier Factor (LOF) algorithm) and a supervised machine learning method (e.g. a classification algorithm such as a decision tree algorithm (DTA)) to history data of drive information. The history data is associated with operation of one or more electric drives corresponding to the drive type of the at least one electric drive. The one or more electric drives may be part of a single process plant or multiple process plants. In an embodiment, the history data of drive information associated with the operation of the one or more electric drives is received by the input interface. Similarly, the history data of a plurality of electric drives corresponding to a plurality of drive types received at the input interface, is used by the computing unit for creating the plurality of models.

For creating each model, the computing unit excludes one or more values of operating parameters prior and post one or more time instances associated with one or more drive trips and drive failures of each electric drive. The one or more drive trips and drive failures are obtained from a fault logger present within the each electric drive. Further, the computing unit excludes one or more values of the operating parameters associated with a de-energized state of the each electric drive during computation of the each model. The de-energized state of the each electric drive is obtained as part of an operating status information of the each electric drive.

The output interface provides the reliability information, comprising a probability of occurrence of an abnormal condition, to the at least one electric drive. Upon receiving the reliability information, the at least one electric drive, communicates using the communication unit at least one condition indication to at least one human machine interface (HMI). In an embodiment, the at least one condition indication is based on the probability of occurrence of the abnormal condition. For example, the communication unit may provide an alert regarding occurrence of the abnormal condition if the probability of occurrence is greater than a predefined threshold.

DETAILED DESCRIPTION OF THE DRAWINGS

Figure 1:
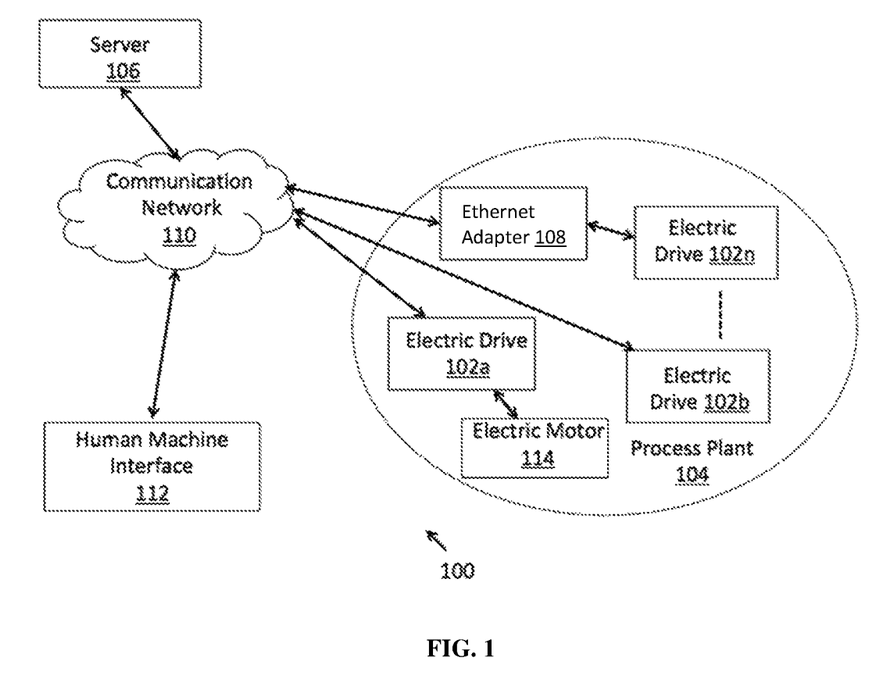
FIG. 1 is a simplified view of an industrial network in which various embodiments of the present disclosure can be practiced.

The present disclosure is related to monitoring condition of an electric drive in a process plant, where the electric drive controls operation of an electric motor. Various embodiments of the present disclosure can be practiced in an environment such as environment 100 shown in FIG. 1. The environment 100 shown in FIG. 1 shows a process plant (104) including a plurality of electric drives (102a-n), where the plurality of electric drives communicate with a server (106) over a communication network (110). In an embodiment, an electric drive (e.g. 102n) may communicate with the server via an Ethernet adapter or a gateway device (108) or a suitable hardware. As shown, an electric drive (e.g. 102a) may control operation of an electric motor (e.g. 114) in the process plant (104).

The plurality of electric drives is also capable of communicating with a human machine interface (HMI) (112) over the communication network. In an embodiment, at least one condition indication corresponding to each electric drive is provided to the HMI. For example, the HMI is a display unit of a computing device, e.g. a smartphone, a laptop, and the like, capable of hosting a maintenance portal. The at least one condition indication may be displayed within the maintenance portal for viewing by a maintenance person or a service engineer. Though, in this embodiment, the HMI is shown as a device/terminal connected on a communication network, the HMI can also be part of the electric drive or connected with the electric drive via a local connection (for e.g. Bluetooth or WIFI) in the process plant. Further, the condition indication can be directly displayed on the HMI of the electric drive.

Though the environment of FIG. 1 shows a single server used along with the plurality of electric drives, for monitoring condition of the plurality of electric drives of a single process plant, it is understood that condition of multiple electric drives operating in one or multiple process plants, can be monitored by using single or multiple servers connected in the communication network 110. Further, though the environment shows that the at least one condition indication of each electric drive is provided to a single HMI, it is understood that at least one condition indication of each electric drive of the multiple electric drives operating in multiple process plants, can be provided to multiple HMI. Also, the server 106 can be part of the process plant and the communication network can be the network of the process plant.

In any case, multiple drives can be connected with a single/multiple servers over one or more communication networks and condition monitoring of the drive(s) is performed with the electric drive and server arrangement. In accordance with some embodiments, the electric drive is coupled to the server via an industrial network. In accordance with some other embodiments, the electric drive and server (or controller) arrangement is integral part of an industrial computer. Here, both the drive and server are part of a single unit. A person skilled in the art would recognize that for condition monitoring, one or more parameters associated with the drive that can indicate or be used to infer a condition/state of the drive are measured/processed or retrieved for further analysis and determination. Also, such further analysis and determination can involve parameters that can be indicative of reliability factors (e.g. time for failure, probabilities associated with failure/success etc.).

In an embodiment, an electric drive retrieves a set of drive information associated with an operation of the electric drive over a time period. The electric drive communicates the set of drive information to the server, based on which one or more reliability factors/information associated with the electric drive are computed using a model corresponding to the drive type of the electric drive. The reliability information include information that indicate a probability of success in functioning of the electric drive.

In an embodiment, the reliability information includes a probability of occurrence of an abnormal condition in a specified future time period. The electric drive obtains the reliability information from the server, and provides at least one condition indication to at least one HMI. The at least one condition indication includes information that indicates a particular condition of the electric drive. The at least one condition (and corresponding reliability information) is based on the probability of occurrence of an abnormal condition. In an embodiment, the at least one condition indication includes an alert regarding the abnormal condition to occur in the specified future time period. In another embodiment, the at least one condition indication may include at least one recommendation to avoid occurrence of the abnormal condition. In an example, the abnormal condition may be a hardware failure occurring in the electric drive.

Upon viewing the at least one condition on the HMI, a maintenance personnel may take precautionary measures to avoid the abnormal condition from occurring in future. For example, the maintenance personnel may follow the at least one recommendation, in order to prevent occurrence of the abnormal condition.

Figure 2:
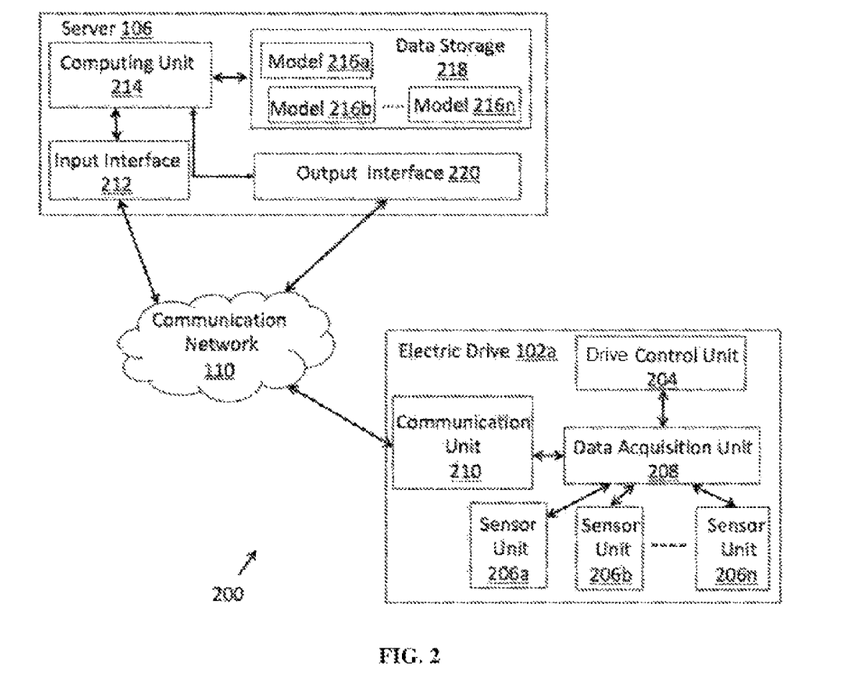
FIG. 2 is a block diagram of electric drive and server arrangement for monitoring condition of at least one electric drive in a process plant, according to an embodiment of the present disclosure.
Figure 3:
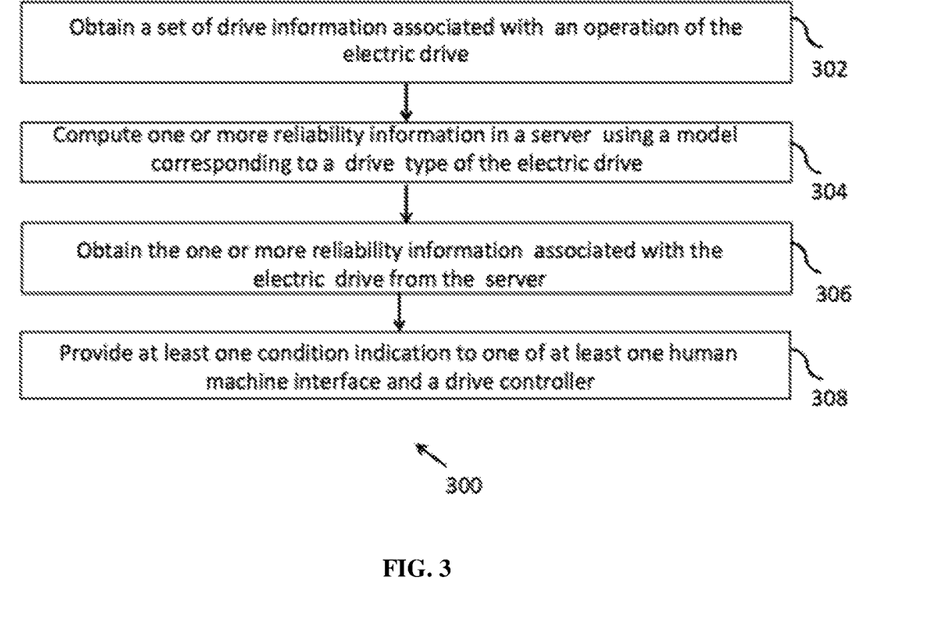
FIG. 3 is a flowchart of a method for monitoring condition of an electric drive in a process plant, according to an embodiment of the present disclosure.

Monitoring condition of the electric drive (102a) by the server (106) is explained in reference to FIG. 2 and FIG. 3.

FIG. 2 is a block diagram of an electric drive and server arrangement (200) for monitoring condition of the at least one electric drive of process plant, according to an embodiment of the present disclosure. The electric drive and server arrangement includes at least one electric drive (e.g. 102a) communicatively coupled to a server (e.g. 106). The at least one electric drive includes a plurality of modules implemented with one or more processors associated with the drive. The server also includes a plurality of modules implemented with one or more processors associated with the server.

In the embodiment of FIG. 2, the at least one electric drive includes a drive control unit (204), one or more sensor units (206a-n), a data acquisition unit (208) and a communication unit (210). Further, in accordance with the embodiment, the server includes an input interface (212), a computing unit (214), a data storage (218) and an output interface (220). Each of the plurality of modules of the at least one electric drive and the server performs one or more steps of a method for monitoring the condition of the at least one electric drive, as disclosed in FIG. 3.

The electric drive together with the server performs condition monitoring and initiating preventive actions or/and controlling to avoid failure of electric drive. A person skilled in the art would recognize that server can be used to store large data and can carry out advanced computations related to model building, selecting/associating a model with a particular electric drive based on its type or other technical characteristics, continuous learning or adaptation/fine tuning of the model based on learning from the data gathered from the particular electric drive or from similar electric drives from the process plant and/or other process plants serviced by the server. The server can accordingly be utilized to provide one or more services/alerts/communication to the electric drive to carry out further activities as per the configurations made in the electric drive (e.g. processing of information sent from the server, providing alerts in a HMI associated with the electric drive or controlling electric drive according to the processed information).

FIG. 3 is an exemplary flowchart of the method for monitoring condition of an electric drive (for example 102a) along with a server (e.g. 106). The method may be performed with an electric drive and server arrangement (e.g. 200). The example provides one kind of arrangement of activities, it is to be recognized that there can be different arrangements arising based on the computing power and communication connectivity available with the electric drive i.e. one or more steps performed at the server can also be performed completely/partially at the electric drive if so configured. In the method of the present disclosure, monitoring of the condition includes determining at least one condition indication related to occurrence of an abnormal condition in an operation of the electric drive in a specified future time period (e.g. after few minutes, hours etc.).

At step 302, a set of drive information associated with an operation of the electric drive in a time period, is retrieved by a data acquisition unit (e.g. 208) of the electric drive. In one embodiment, the set of drive information includes values of operating parameters, and operating status information of the electric motor in the time period.

The values of the operating parameters are measured by one or more sensor units (e.g. 206a-n). For example, a current sensor can measure a value of drive current flowing through the electric drive during the predefined time period. One or more operating parameters associated with an operation of the electric drive are determined by a drive control unit (e.g. 204). For example, the drive control unit can determine a frequency of the drive current.

The operating status information includes one or more time instances associated with an energized state, idle state or a de-energized state of an electric motor that is controlled by the electric drive. Alternatively, the operating status information includes time instances when the electric drive is in an 'On' state, 'Idle' state and an 'Off' state. In an embodiment, the operating status information is obtained from a status indicator of the electric drive. As an example, the main status word (MSW) signal, or other logical indicator, can be used. The MSW is decoded to automatically detect when the electric drive is in the 'Off' state (switched off) during the predefined time period.

The electric drive communicates the set of drive information using a communication unit (e.g. 210) to the server via a communication network (e.g. 110). In an embodiment, the electric drive communicates over a wireless communication network to the server. In case the drive and server are integral part of the industrial computer, they communicate with each other through internal I/O interfaces that are part of the industrial computer. The server receives the set of drive information at an input interface (e.g. 212).

At 304, the server computes using a computing unit (e.g. 214) reliability information associated with the electric drive. The computing unit uses the set of drive information and a model (e.g. 216a) corresponding to a drive type of the electric drive for computing the reliability information. The reliability information includes one or more conditions of the electric drive in a future time period. In an embodiment, the reliability information includes a probability of occurrence of an abnormal condition in a specified future time period (e.g. after few minutes, hours etc.), one or more abnormal operating instances identified during the predefined time period, and an expected time for occurrence of the abnormal condition. Further, the reliability information can include at least one recommendation corresponding to an operation of the electric drive.

In order to predict occurrence of abnormal conditions or anomalies in operation of the electric drive in future, it is essential to filter the set of drive information. Filtering of the set of drive information includes, but is not limited to, removing values of drive parameters corresponding to abnormal conditions that are known and recorded, from the values of the drive parameters obtained in the set of drive information. Filtering may also include removing values of drive parameters corresponding to a switched off or idle state of electric drive.

The computing unit accordingly obtains one or more time instances associated with one or more drive trips and drive failures from the set of drive information. Aforesaid one or more drive trips refer to those abnormal conditions of the electric drive that were logged or recorded in the predefined time period. The computing unit obtains one or more values of the drive parameters prior and post the one or more time instances and excludes the one or more values of the drive parameters from the values of the drive parameters.

Further, the computing unit obtains one or more values of the drive parameters at time instances when the electric motor is in the de-energized state from the set of drive parameters, and excludes the one or more values of the drive parameters, when the motor is in the de-energized state, from the values of the drive parameters. As a result, the set of drive information are filtered to exclude data related to drive trips that are recorded and data related to switched off condition of the electric drive during the predefined time period.

Further, the computing unit selects the model from a plurality of models (216a-n), where the model corresponds to a drive type of the electric drive. Each model of the plurality of models corresponds to a drive type of an electric drive. The model is created (e.g. by the computing unit), from history data of drive parameters associated with operation of one or more electric drives that correspond to a particular drive type. The input interface receives the history data of drive parameters associated with operation of a plurality of electric drives present in one or multiple process plants. The one or more electric drives used for creating a model, may be in one or more process plants. Creating of the model is described in reference to FIGS. 4A-4B. The plurality of models is stored in a data storage (e.g. 218).

In an embodiment, the data storage is internal to the server as shown in FIG. 2. In another embodiment, the data storage is a database located external to the server and communicatively coupled to the server over a cloud network. The computing unit uses the filtered set of drive information and the model to compute the reliability information. The output interface (e.g. 220) provides the reliability information to the electric drive. For example, the reliability information can include a probability of occurrence of an abnormal condition, a time of occurrence of the abnormal condition in the electric drive, and a number of abnormal operation points identified during the predefined time period. In the example, at least one recommendation for preventing occurrence of the abnormal condition can also be communicated to the electric drive.

At 306, the communication unit of the electric drive obtains the reliability information from the server. The reliability information is communicated by the output interface via the communication network to the electric drive.

At 308, upon receiving the reliability information, the electric drive communicates, using the communication unit, at least one condition indication to at least one human machine interface (e.g. 112). The at least one condition indication is based on the reliability information. In an embodiment, the at least one condition indication is based on the probability of occurrence of the abnormal condition. In an embodiment, the at least one condition indication includes at least one alert or at least one recommendation corresponding to the operation of the electric drive. For example, the condition indication includes an alert regarding occurrence of the abnormal condition at a future time instant, and a time remaining for the occurrence.

The at least one condition indication, is provided when the probability of occurrence of the abnormal condition is determined to be greater than a first threshold. The probability of occurrence of the abnormal condition is determined to be greater than the first threshold when the number of abnormal operating instances identified during the predefined time period is greater than a second threshold. For example, if the number of abnormal operating instances identified (by the computing unit) during the predefined time period is 10, and the second threshold is set to 8, then the probability of occurrence of the abnormal condition is greater than the first threshold, implying that an alert (at least one condition) needs to be provided to the HMI regarding the impending occurrence.

In an embodiment, the HMI is display interface of a computing device that is communicatively coupled to the electric drive over the communication network. For example, the at least one condition indication may be displayed in a web portal, hosted in the computing device. Examples of the computing device include, but are not limited to, a mobile phone, a desktop, a tablet, a laptop, a smartphone, a server and the like. A maintenance person may view the at least one condition indication, and take appropriate measures to avoid occurrence of the abnormal condition. Creation of the model for the electric drives is explained in reference to FIG. 4A and FIG. 4B.

Figure 4A:
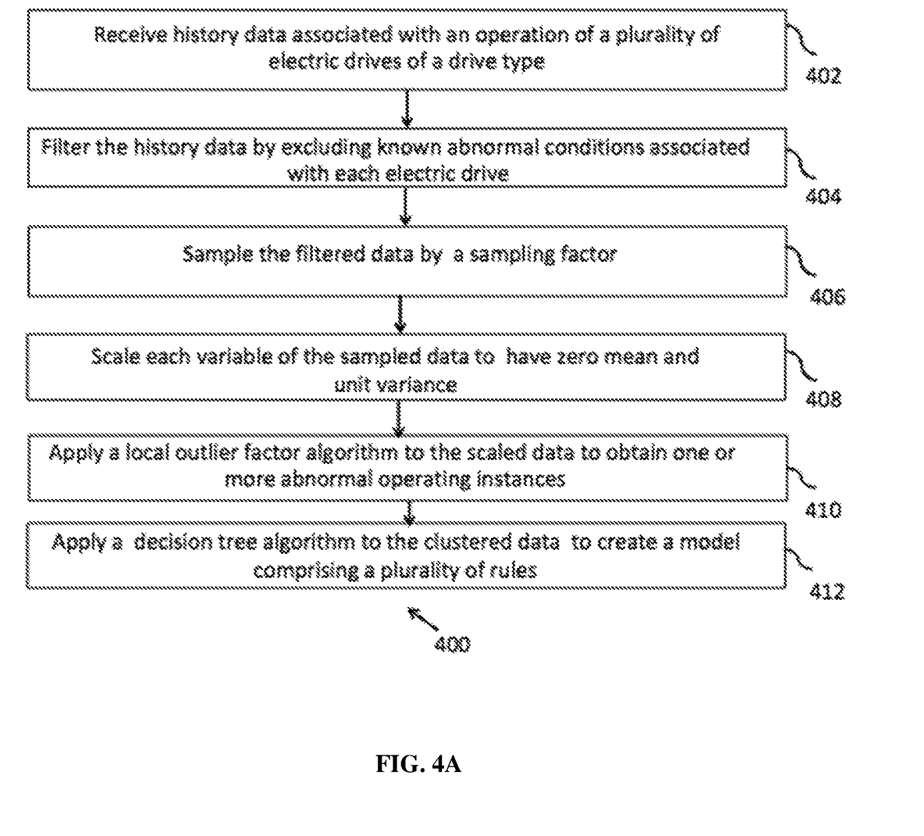
FIGS. 4A-4B are a flowchart of creating a model used for obtaining reliability information associated with an electric drive in a process plant, according to an embodiment of the present disclosure.
Figure 4B:
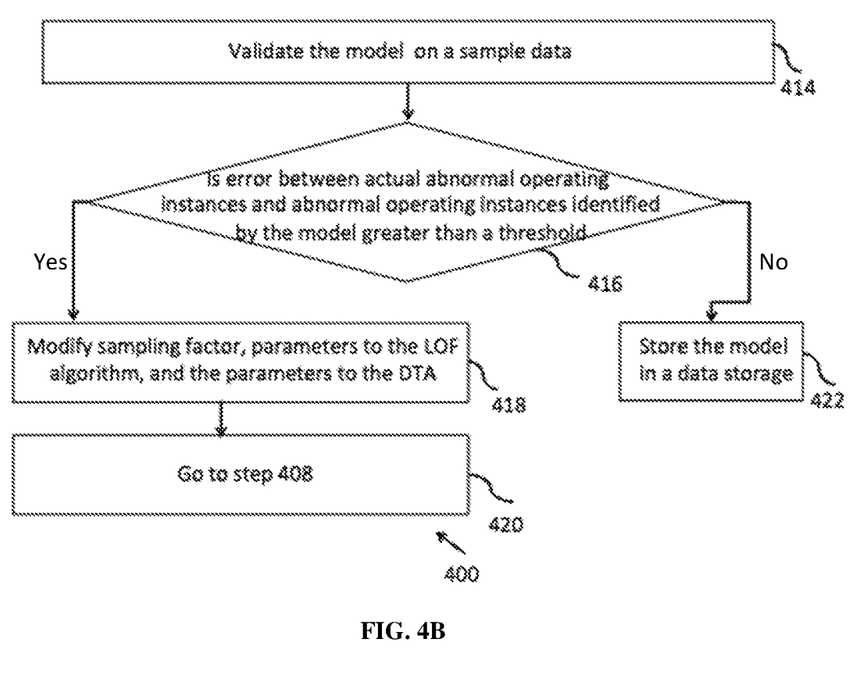

FIG. 4A and FIG. 4B illustrate a flowchart 400 illustrating creation of a model for an electric drive. At 402, history data of drive parameters associated with operation of a plurality of electric drives of a drive type(s) is obtained. The drive type corresponds to the drive type of the electric drive, for which the model is created. Alternatively, history data of electric drives belonging to the same drive type is obtained by the input interface of the server, from the plurality of electric drives via the communication network.

At 404, the computing unit filters the history data of drive parameters (drive information) associated with operation of each electric drive by excluding abnormal conditions that are recorded and known in respect to each drive (or drive type). For example, values of operating parameters corresponding to recorded drive trips and failures are excluded, and values of the drive parameters when the electric drive is in a de-energized state are excluded from the history data. The one or more time instances associated with the recorded drive trips and drive failures is retrieved from a fault logger associated with the each electric drive. In an embodiment, the fault logger is a memory chip that stores various drive trips occurring in the each electric drive. Further, values of operating parameters, when the electric drive is in the switched off state is also excluded from the history data of each electric drive. In an embodiment, the switched off state information is obtained from an operating status information of the electric drive. The operating status information can be obtained from the status indicator. Excluding abnormal conditions that are recorded (known) is essential so that the model is created keeping in focus anomalies that are new to a domain expert, or do not warrant alert/warnings.

At 406, the filtered history data, is sampled by a sampling factor, to achieve reduction in sample size. The sampling factor is a configurable parameter. Further, each sample may be subjected to averaging to remove transient effects and noise from the data. For example, sample size can be 30 seconds, 1 minute or 5 minutes depending on amount of measurement noise in the history data, and a volume of the history data. Sampling of the history data is optional in case, the computing unit has a computing ability for processing large sizes of data.

At 408, each variable of the sampled data is scaled to achieve zero mean and unit variance. Sampling data ensures that various variables having different scales (e.g. voltages from 0 to 230 volts, current from 0 to 10 Amps, and frequency ranging from 0 to 100 Hertz) are scaled to a common scale to avoid creating a bias in the model.

At 410, a local outlier factor (LOF) algorithm is applied to the scaled data to obtain one or more abnormal operating instances. The LOF is used to label the the history data based on relative distance of operating points to neighbors. A LOF distance is calculated for each operating point in the history data, and the data points that lie beyond a threshold distance are considered as outliers or abnormal operating instances. A number of outliers and the threshold distance are configurable parameters to the LOF algorithm.

At 412, a classification algorithm, e.g. decision tree algorithm (DTA), is applied to the clustered data to create the model. The DTA determines variables on which branching of a tree needs to be done. The DTA also determines a threshold of a variable at which a decision needs to be taken. Accordingly, the model includes a plurality of rules comprising thresholds of various drive parameters that need to be taken into account in determining one or more conditions of the drive.

At 414, the model is validated on a sample data of drive parameters. In an embodiment, the sample data includes a set of drive information of an electric drive obtained over a period of time that is not a part of the history data. The sample data is provided as an input to the model, to obtain reliability information, e.g. identification of abnormal operating instances during the period of time. The identified abnormal instances can be compared with actual abnormal operating instances present in the sample data to determine accuracy of the model.

At 416, if the error between the actual abnormal operating instances is greater than the identified abnormal operating instances, then the method flows to step 418, else the method flows to step 422. At 418, the configurable parameters of the model such as the sampling factor, the number of outliers of the LOF, a depth of the DTA, and threshold for various variables involved in the DTA, can be modified for retraining the model. The method then flows to step 402, for retraining the model with the new set of history data.

At 422, as the error is less than the predefined threshold, the model is determined to be acceptable, and thereby the model is stored in the data storage. The model thus stored is subjected to a continuous learning process on the server. The learning process includes modifying the configurable parameters to adapt the model to new sets of data parameters. In an embodiment, the model corresponding to the drive type of the electric drive is stored in an inbuilt memory of the electric drive. The model is subjected to the learning process within the electric drive. An example model is explained with reference to FIG. 5

Figure 5:
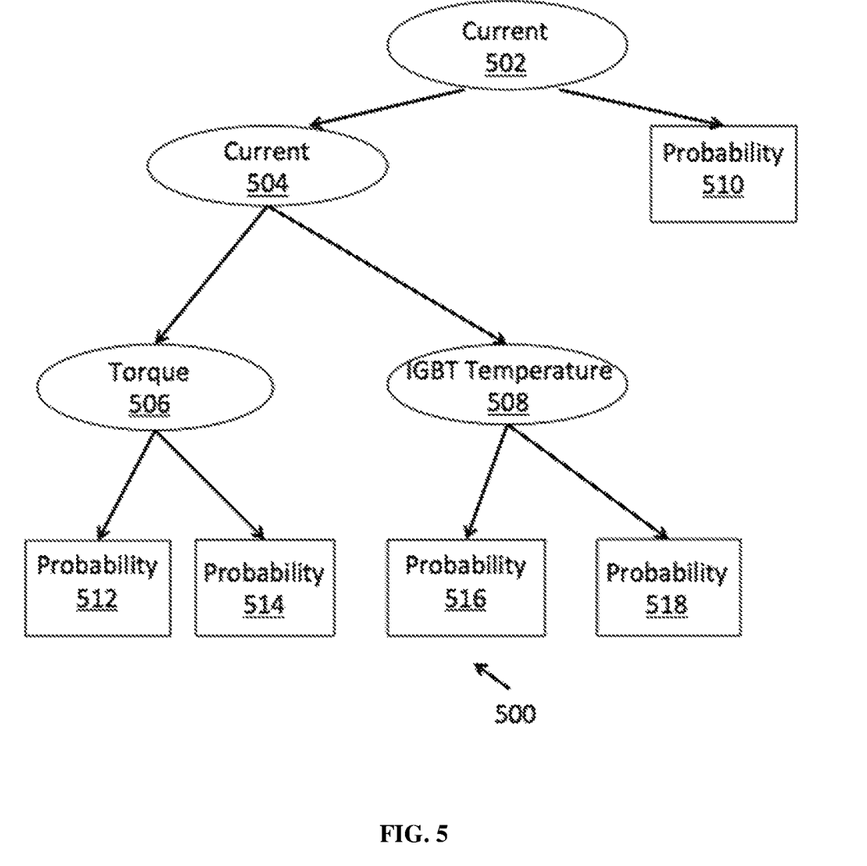
FIG. 5 is an example illustration of the model referred to in FIGS. 4A-4B, according to an embodiment of the present disclosure.

FIG. 5 illustrates implementation of an example model 500. The model 500 includes a plurality of anomaly detection rules, hereinafter referred to as rules. At 502, value of a drive current variable is checked against a first threshold (e.g. 512 Amperes). In case the current variable is found to be greater than the first threshold, the rule flows to 510, where a probability of occurrence of an abnormal instance is calculated based on the rules. In case the probability is found to be equal to '1', occurrence of abnormal instance is determined as positive.

However, in case the current variable is determined to be lesser than the first threshold, execution of the model flows to step 504. At 504, the checks value of the current variable against a second threshold (e.g. 466). In case the value of the drive current is greater than the second threshold, execution flows to step 508, where IGBT temperature is checked against a third threshold. Accordingly, if the value of the drive current is less than the second threshold, execution flows to step 506, where torque is checked against a fourth threshold. Based on the values of the variables, a probability of occurrence is calculated using the rules of the model. For example, if the execution flows to step 508, and the IGBT temperature is found to be lesser than the third threshold (e.g. 75), then the execution flows to step 516, where a probability of 0.01 is obtained, implying a remote possibility of occurrence of an abnormal condition.

Accordingly, the model provides a probability of occurrence of the abnormal condition and abnormal values of drive variables that led to the abnormal condition. Example implementations of the model are explained in reference to FIG. 6-8.

Figure 6:
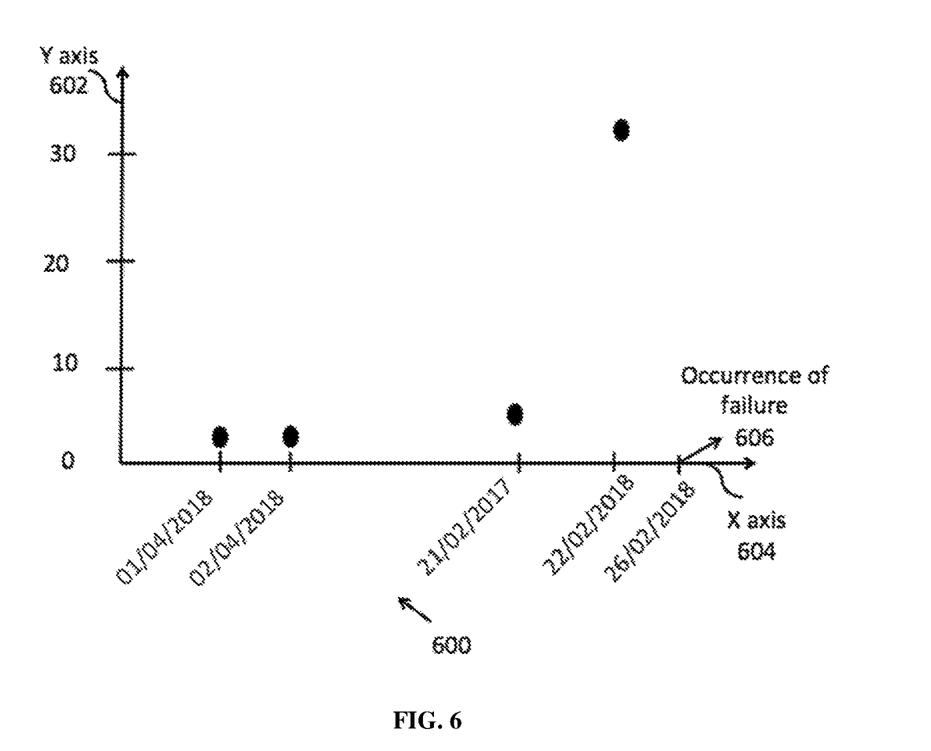
FIG. 6 is a graphical representation of a number of abnormal conditions of an electric drive obtained by using the model referred to in FIGS. 4A-4B in a time period, according to an embodiment of the present disclosure.

FIG. 6, is a graphical representation (600) of a number of abnormal conditions determined by a model, when the model is validated against sample data for month of February 2018 for an electric drive operating in an example process plant. As shown, throughout the month of February, 2018, number of abnormal conditions determined were normal except on 22 Feb. 2018 where 31 abnormal conditions are determined by the model. The model determined the abnormal condition as the drive current was greater than the first threshold (e.g. 512 Amperes) on seven occasions on 22 Feb. 2018. The results of the model is validated by comparing the result against actual data for the month of February, 2018. The actual data includes occurrence of hardware failure (606) of the electric drive on 26 Feb. 2018. Hence, the model can be said to be validated, as the model identified anomalous operating condition of the drive four days prior to the actual hardware failure.

Figure 7:
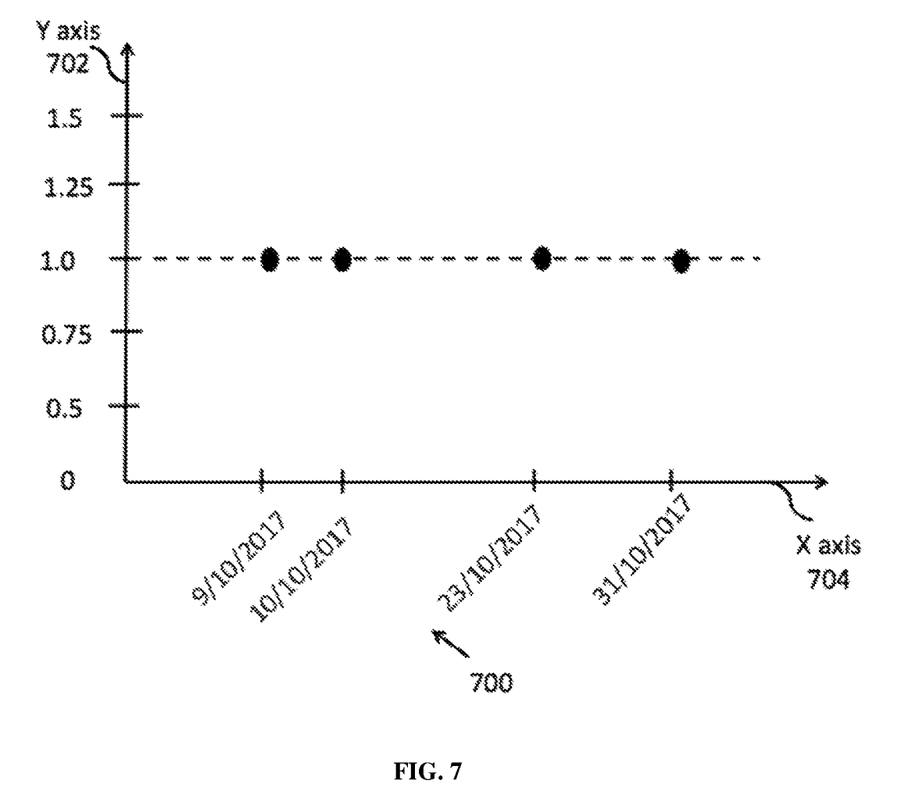
FIG. 7 is a graphical representation of a number of abnormal conditions occurring in an electric drive during a period of time in an electric drive, according to an embodiment of the present disclosure.

FIG. 7 is an example representation (700) of at least one condition indication of an electric drive provided by a model, for the month of October 2017. The model is trained on history data obtained in month of January 2017. As shown, the model predicts a total of 4 abnormal conditions or abnormalities in the month of October 2017, each having a probability of occurrence of '1'. One abnormal condition is determined on 9 Oct. 2017, another abnormal condition on 10 Oct. 2017, a third abnormal condition on 23 Oct. 2017, and a fourth on 21 Oct. 2017. As the anomalies detected are small, equivalent to only 4 minutes of operation of the electric drive, the model provides a normal operating condition of the electric drive for the month of October 2017. Validation of the model against actual data obtained for the month of October 2017 along with observations of a subject matter expert proves the condition indication provided by the model as accurate.

Figure 8:
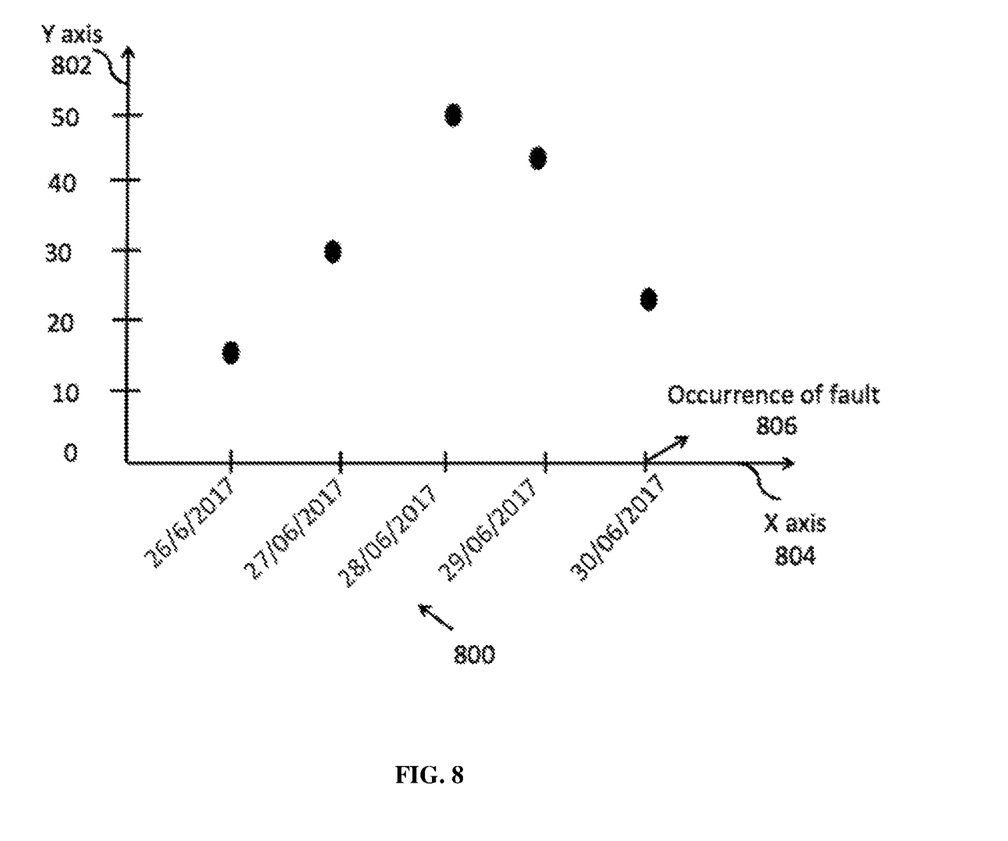
FIG. 8 is a graphical representation of a probability of occurrence of an abnormal condition determined by a model of the electric drive in a time period, according to an embodiment of the present disclosure.

FIG. 8 is a graphical representation (800) of a number of abnormal conditions, determined by an example model, for an electric drive in a month of June 2017. As the drive current is determined by the model to be greater than the first threshold, in the month of June 2017, the model provided a total of 166 anomalies prior to 30 Jun. 2017. The model further predicted an abnormal condition on 30 Jun. 2017. The prediction was accurate, as due to failure of the cooling system, the electric drive experienced an occurrence of a fault (806) on 30 Jun. 2017.

Aforesaid illustrations explain implementation of the model within the electric drive server arrangement in determining abnormal conditions of the electric drive in a future time period/instant. Upon determining the abnormal conditions, the drive server arrangement can further determine at least one condition indication to be provided to the HMI for addressing the determined condition of the electric drive.

Thus, in accordance with one or more implementations, an electric drive obtains drive information (i.e. sensed with the sensors of the drive, determined with a control unit/controller of the drive) and provides the same to a server. The server processes the information with a model specific for the drive (i.e. tuned to the drive according to the drive type and/or the environment) to obtain reliability information associated with occurrence of an abnormal condition at a future instant of time or in a future time period. This model may be stored remotely, in case the server is a network server, or on a local memory, when the server and drive are part of a single unit (e.g. industrial computer). The obtained reliability information is communicated back to the electric drive, and is utilized at the drive for provide a condition indication. The condition indication can be provided as an alert or warning on an HMI of the drive (or connected over a network with the drive), for attention of maintenance personnel. Alternately, the condition indication can be provided to the drive controller to take preventive actions as required.

Accordingly, the disclosed method and electric drive and server arrangement enables efficient condition monitoring of electric drives in a process plant. Prior detection of abnormal conditions along with abnormal values of drive variables responsible for the abnormal conditions, aid in providing efficient recommendations on time to prevent occurrence of the abnormal conditions, and thereby avoiding operation downtimes in industrial process plants.

The invention claimed is:

1. A method for monitoring a condition of an electric drive in a process plant, the electric drive for controlling operation of an electric motor, the method comprising:
    obtaining, with the electric drive from at least one of a drive control unit and one or more sensor units, a set of drive information associated with an operation of the electric drive in a time period and operating status information of the electric motor in the time period, wherein the set of drive information comprises values of operating parameters of the electric drive;
    obtaining, with the electric drive from a server, reliability information associated with the electric drive, wherein the reliability information comprises a probability of occurrence of an abnormal condition in a future time period, wherein the reliability information is computed in the server using the set of drive information and a model corresponding to the drive type of the electric drive, the server comprising an input interface, a computing unit, and an output interface; and
    providing, with the electric drive to one of a human machine interface and a drive controller, at least one condition indication regarding the abnormal condition based on the probability of occurrence of the abnormal condition,
    wherein the input interface is configured to receive the set of drive information for a time period from a communication unit of the electric drive.

2. The method of claim 1, wherein the operating status information of the electric motor is obtained from a status indicator associated with the electric drive, wherein the operating status information comprises one or more time instances associated with one of an energized state, an idle state, and a de-energized state of the electric motor during the time period, and wherein one or more values of the operating parameters at time instances when the electric motor is in the de-energized state are excluded from the values of the operating parameters during computation of the reliability information in the server.

3. The method of claim 2, wherein obtaining the reliability information further comprises obtaining one or more values of one or more operating parameters affecting the abnormal condition, wherein a value of an operating parameter is determined to affect the abnormal condition in the server using the model corresponding to the drive type.

4. The method of claim 3, wherein the reliability information further comprises a condition of the electric drive at a present instant, one or more abnormal operating instances identified during the time period, an expected time for occurrence of the abnormal condition, and at least one recommendation corresponding to an operation of the electric drive.

5. The method of claim 4, wherein the at least one condition indication is provided when the probability of occurrence of the abnormal condition is greater than a first threshold, wherein the probability of occurrence of the abnormal condition is greater than the first threshold when a number of abnormal operating instances identified during the time period is greater than a second threshold.

6. The method of claim 3, wherein providing the at least one condition indication further comprises providing one or more of an alert and a recommendation when the at least one condition indication is provided to the HMI, wherein the recommendation depends on the one or more operating parameters that affected the abnormal condition.

7. The method of claim 3, wherein providing the at least one condition indication further comprises providing at least one recommendation to the drive controller, wherein the drive controller initiates corrective action to prevent occurrence of the abnormal condition based on the at least one recommendation, wherein the at least one recommendation depends on the one or more operating parameters that affected the abnormal condition.

8. The method of claim 1, wherein the model is configured from history data associated with an operation of a plurality of electric drives in a plurality of process plants, wherein the history data of each electric drive of the plurality of electric drives comprises a plurality of drive information obtained over a period of time, wherein the plurality of electric drives correspond to the drive type of the electric drive.

9. The method of claim 1, wherein the output interface is configured to communicate the computed reliability information to a communication unit of the at least one electric drive.

10. An apparatus, comprising:
    at least one electric drive configured to control operation of an electric motor in a process plant, wherein the at least one electric drive comprises:
        one or more sensor units configured to measure values of operating parameters of the at least one electric drive,
        a drive control unit configured to determine a set of drive information associated with the at least one electric drive, wherein the set of drive information comprises the values of the operating parameters,
        a data acquisition unit configured to obtain the set of drive information from at least one of the drive control unit and the one or more sensor units, and
        a communication unit configured to communicate at least one condition indication to at least one human machine interface, the at least one condition indication being based on a probability of occurrence of an abnormal condition in a future time period; and
    a server coupled to the electric drive, the server comprising:
        an input interface configured to receive the set of drive information for a time period from the communication unit of the at least one electric drive,
        a computing unit configured to compute reliability information associated with the at least one electric drive, based on a model corresponding to a drive type of the at least one electric drive selected by the computing unit from among a plurality of models corresponding to different drive types, wherein the reliability information comprises the probability of occurrence of the abnormal condition in the future time period, a condition of the at least one electric drive at a present instant, one or more abnormal operating instances identified during the time period, and an expected time for occurrence of the abnormal condition, and an output interface configured to communicate the computed reliability information to the communication unit of the at least one electric drive.

11. The apparatus of claim 10, wherein the computing unit of the server is configured to create each of the plurality of models by applying a machine learning method to history data associated with operation of a plurality of electric drives corresponding to a drive type, wherein the history data comprises a plurality of drive information received by the communication unit of the at least one electric drive over a period of time.

12. The apparatus of claim 11, wherein the computing unit is further configured to exclude one or more values of the operating parameters prior and post one or more time instances associated with one or more drive trips and drive failures of the at least one electric drive during the creation of each model, and wherein the one or more time instances of the one or more drive trips and drive failures are part of the history data.

13. The apparatus of claim 12, wherein the computing unit is further configured to exclude one or more values of the operating parameters associated with a de-energized state of the at least one electric drive during the creation of each model, and wherein time instances of the de-energized state of the at least one electric drive are obtained as part of the history data.

* * * * *